US009274140B2

(12) United States Patent
Rose et al.

(10) Patent No.: US 9,274,140 B2
(45) Date of Patent: Mar. 1, 2016

(54) MULTI-PURPOSE INTEGRATED CIRCUIT DEVICE CONTACTOR

(71) Applicant: SILICON LABORATORIES INC., Austin, TX (US)

(72) Inventors: Larry R. Rose, Buda, TX (US); Craig N. Gabelmann, Austin, TX (US); Wenshui Zhang, Singapore (SG)

(73) Assignee: Silicon Laboratories Inc., Austin, TX (US)

(*) Notice: Subject to any disclaimer, the term of this patent is extended or adjusted under 35 U.S.C. 154(b) by 228 days.

(21) Appl. No.: 13/771,889

(22) Filed: Feb. 20, 2013

(65) Prior Publication Data

US 2014/0232425 A1 Aug. 21, 2014

(51) Int. Cl.
*G01R 31/20* (2006.01)
*G01R 1/04* (2006.01)

(52) U.S. Cl.
CPC .................................... *G01R 1/0433* (2013.01)

(58) Field of Classification Search
CPC ............. G01R 1/0433; G01R 31/2889; G01R 31/31095; G01R 33/6896
USPC ............ 324/750.25, 500, 750.2–750.26, 537, 324/750.15, 754.01, 754.02, 755.01, 324/756.01–756; 702/85; 29/382
See application file for complete search history.

(56) References Cited

U.S. PATENT DOCUMENTS

| | | | |
|---|---|---|---|
| 5,559,445 A | 9/1996 | Eaddy et al. | |
| 5,623,123 A * | 4/1997 | Umehara | 174/529 |
| 5,828,223 A | 10/1998 | Rabkin et al. | |
| 5,945,837 A | 8/1999 | Fredrickson | |
| 6,836,110 B1 | 12/2004 | Ha et al. | |
| 7,501,839 B2 | 3/2009 | Chan et al. | |
| 8,062,039 B2 | 11/2011 | Farris et al. | |
| 2010/0134126 A1* | 6/2010 | Hong et al. | 324/757 |
| 2011/0081750 A1* | 4/2011 | Machida | 438/123 |
| 2011/0193584 A1 | 8/2011 | Roberts | |

* cited by examiner

*Primary Examiner* — Melissa Koval
*Assistant Examiner* — Trung Nguyen
(74) *Attorney, Agent, or Firm* — Abel Law Group, LLP (57) ABSTRACT

A contactor uses a pogo block in a first configuration as a direct integrated circuit test socket and the contactor can be reconfigured to provide a pogo block assembly to interface between a main test printed circuit board (PCB) and a daughter card that is dedicated to a specific device handler and/or a specific package type that can be different from the main test PCB. A pogo block is inserted into a thick frame with an alignment plate for contactor use in which a device under test fits into a recess in the frame through an alignment plate to align the device under test to make contact with electrical contacts of the contactor. The frame and guide plate can be removed and a thinner frame coupled to the contactor, which changes its function to a pogo block assembly.

20 Claims, 12 Drawing Sheets

MULTI-PURPOSE INTEGRATED CIRCUIT DEVICE CONTACTOR

BACKGROUND

1. Field of the Invention

This invention relates to integrated, and circuit testers more particularly to testers for packaged integrated circuits.

2. Description of the Related Art

Integrated circuits require testing at various stages of manufacturing including wafer testing and testing after integrated circuits have been packaged. Testing of packaged integrated circuits typically requires use of a printed circuit board (PCB) and a tester that has been designed to accommodate the function and particular packaging and pin-out of the device under test. As product families develop, they tend to change by utilizing different sized packages, different pin-outs, additional pins for additional functions, different package types, or some combination of changes. However, the need to modify the integrated circuit PCB for each product iteration can be expensive and time consuming.

SUMMARY

Accordingly, an embodiment provides a way to reuse a substantial part of an original PCB for testing a variety of package types, pin-outs and/or package sizes of an integrated circuit family, which can be particularly useful as a product family grows.

In an embodiment, a test apparatus includes a first printed circuit board. A pogo block is electrically connected to the first printed circuit board on a first side of the pogo block. In a first configuration the pogo block is configured to be electrically connected to a packaged integrated circuit under test and in a second configuration the pogo block is electrically connected on a second side of the pogo block to a second printed circuit board.

In another embodiment a tester apparatus includes a first printed circuit board. In a first configuration a pogo block assembly includes a plurality of pogo blocks and a first frame is configured to be electrically connected to the first printed circuit board and to receive a packaged integrated circuit under test. In a second configuration the plurality of pogo blocks are coupled to a second frame, thinner then the first frame, and electrically connected to the first printed circuit board and electrically connected to a second printed circuit board.

In another embodiment a method of configuring a tester includes configuring the tester in a first or second configuration, wherein configuring the tester in the first configuration includes, securing a pogo block to a first frame and an alignment plate to form a first contactor assembly, the alignment plate to align a packaged integrated circuit under test and electrically connecting the pogo block to a first printed circuit board. In configuring the tester in a second configuration, the pogo block is secured to a second frame thinner than the first frame and the first printed circuit board is electrically coupled to one side of the pogo block and a second printed circuit board is electrically connected to another side of the pogo block. A contactor assembly including another pogo block, frame, and alignment plate is coupled to the second printed circuit board.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items. Note that where identical items are shown in a figures, all of the identical items may not be identified by reference numerals.

DETAILED DESCRIPTION

Figure 1:
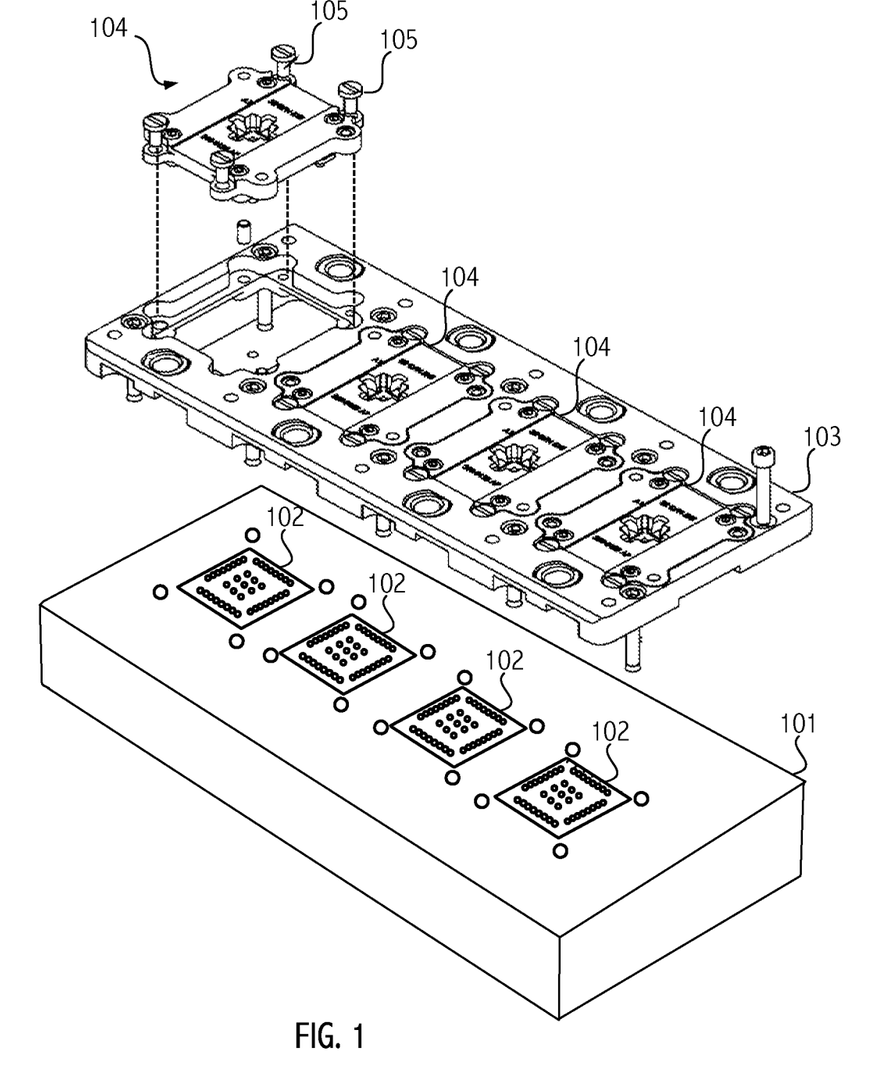
FIG. 1 illustrates an embodiment of a first configuration of test hardware.

Referring to FIG. 1, illustrated is a first configuration for test hardware according to an embodiment. The first configuration includes a base PCB 101 (shown in simplified form)

that provides an interface (not shown) to a test system and control computer so that appropriate testing can be performed on devices under test. The base PCB includes electrical contacts 102 that are intended for a particular package size and pin-out. While four sets of contacts (sites) 102 are shown on the base PCB 101, that number of sites is illustrative and any appropriate number of sets of contacts in any appropriate contact arrangement may be provided according to the needs of the integrated circuit being tested.

The first configuration also includes a frame 103. The frame receives a pogo block and alignment plate assemblies 104. The alignment plate provides for alignment of the device under test with the electrical contacts of the pogo block. The electrical contacts of the pogo block provide an electrical connection between the electrical contacts 102 of the base PCB 101 and the device under test (not shown). The frame 103 accommodates four pogo block and alignment plate assemblies 104. Note that the quad configuration is exemplary and the frame may accommodate anywhere from a single pogo block and alignment plate assembly up to a number of pogo block and alignment plate assemblies suitable for use in a particular embodiment. In an embodiment of the first configuration, the frame 103 is sufficiently thick to receive the alignment plate, which provides a recess for the device under test. The pogo block and alignment plate assembly 104 attaches to the frame 103 using screws 105.

Figure 2:
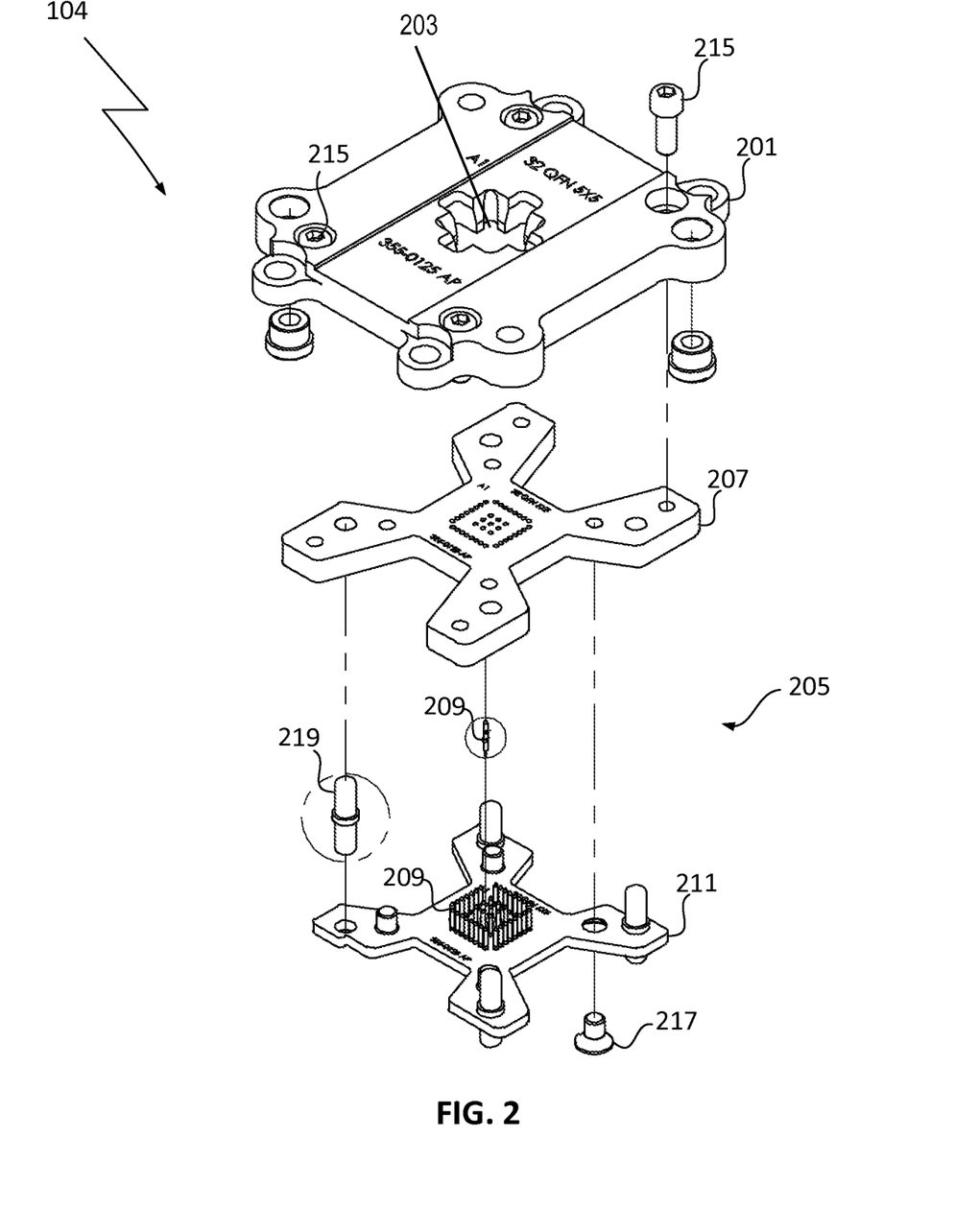
FIG. 2 provides an exploded view of the assembly formed by a pogo block and alignment plate.

FIG. 2 provides an exploded view of the pogo block and alignment plate assembly 104. The alignment plate 201 has a hole 203 shaped to align the device under test with the pogo pins of the pogo block 205. The pogo block 205 is formed of a first portion 207 which receives the pogo pins 209. A pogo pin retainer portion 211 of the pogo block 205 retains the pins in the first portion 207. Screws 217 secure the pogo pin retainer portion 211 to the first portion 207. Pins 219 align the two portions of the pogo block. Screws 215 secure the alignment plate to the pogo block 205.

Figure 3:
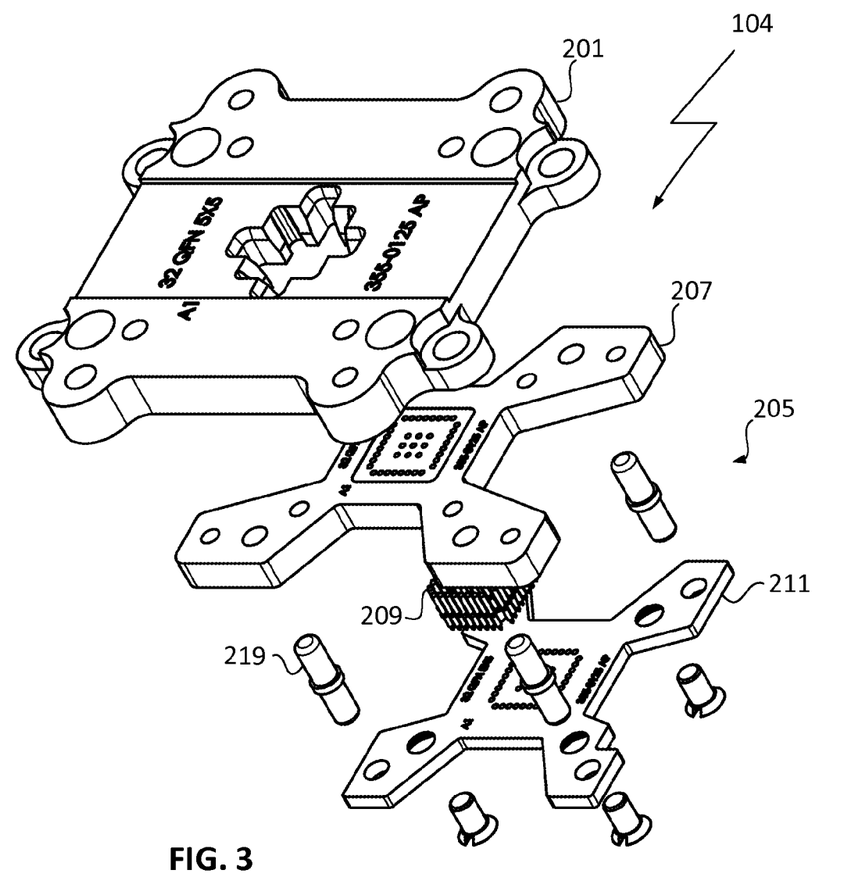
FIG. 3 shows another exploded view of the pogo block and alignment plate assembly.
Figure 4:
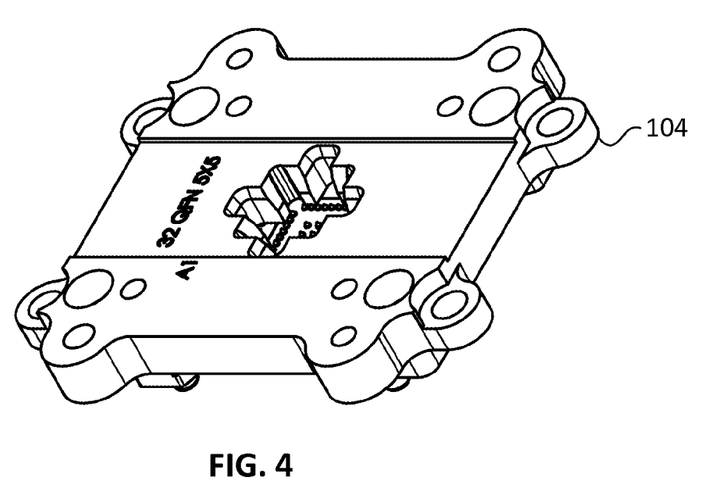
FIG. 4 shows a view of the pogo block and alignment plate assembly 104, where the pogo block is visible through the alignment hole in the alignment plate.

FIG. 3 shows another exploded view of the pogo block and alignment plate assembly 104. FIG. 4 shows a view of the pogo block and alignment plate assembly 104, where the pogo block contacts are visible through the alignment hole in the alignment plate.

Figure 5:
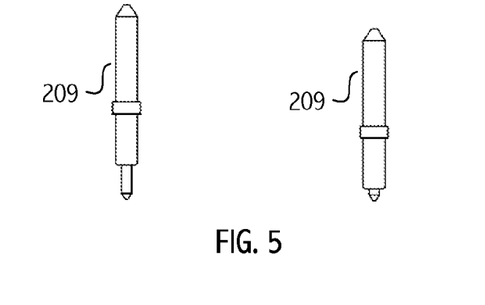
FIG. 5 shows details of the pogo pins.
Figure 6:
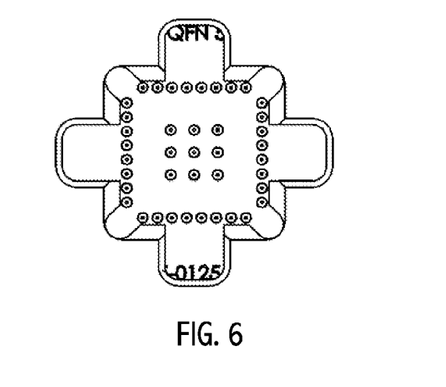
FIG. 6 shows a top view of a detail of the alignment plate and pogo block assembly.

FIG. 5 shows details of the pogo pins 209, which are spring-loaded electrical contacts. In the view on the left, the pogo pin is not compressed and in the second view, the pogo pin is compressed. FIG. 6 shows a top view of a detail of the alignment plate and pogo block assembly 104.

Figure 7A:
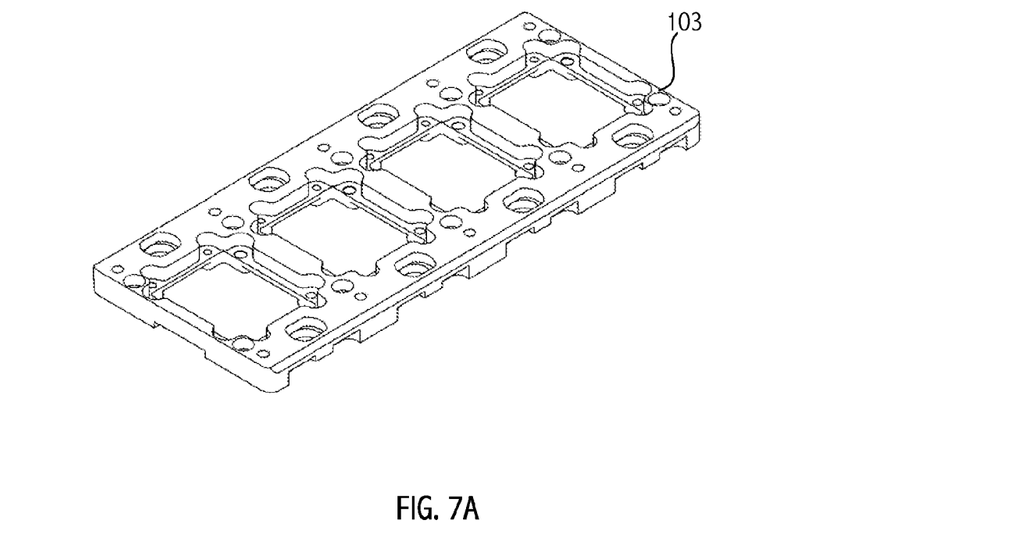
FIG. 7A shows a top view of the frame used in an embodiment of the first configuration.
Figure 7B:
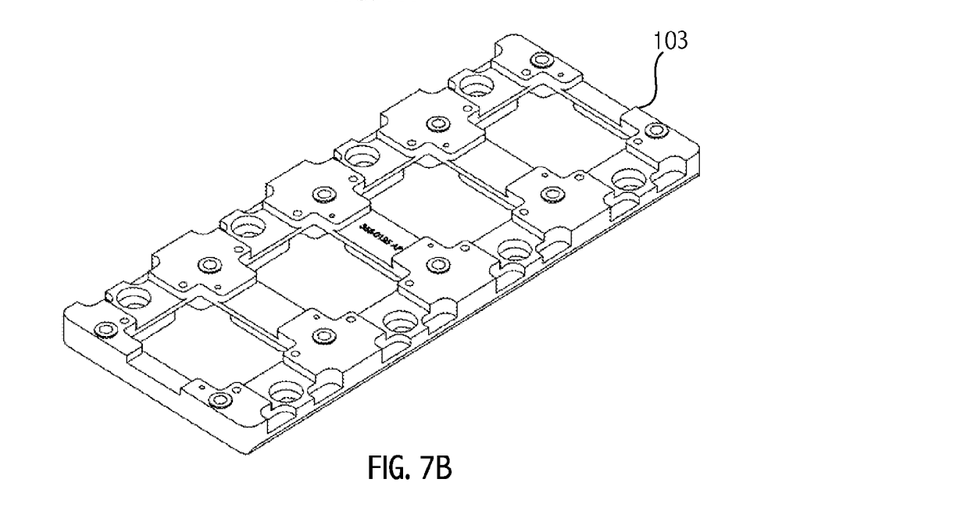
FIG. 7B shows a bottom view of the frame used in an embodiment of the first configuration.
Figure 8A:
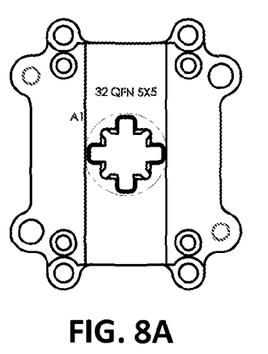
FIG. 8A shows a top view of the alignment plate.
Figure 8B:
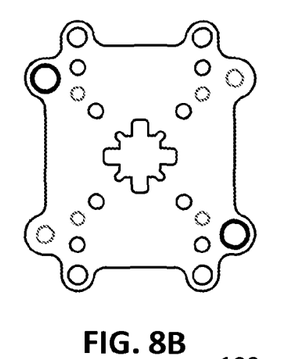
FIG. 8B shows a bottom view of the alignment plate.
Figure 9A:
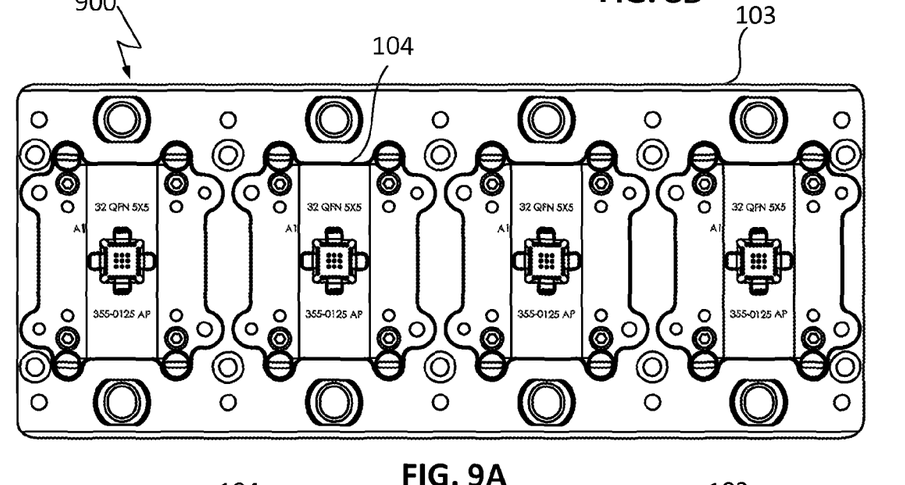
FIG. 9A shows a top view of the contactor assembly formed by the pogo block and alignment plate assembly secured to a frame.
Figure 9B:
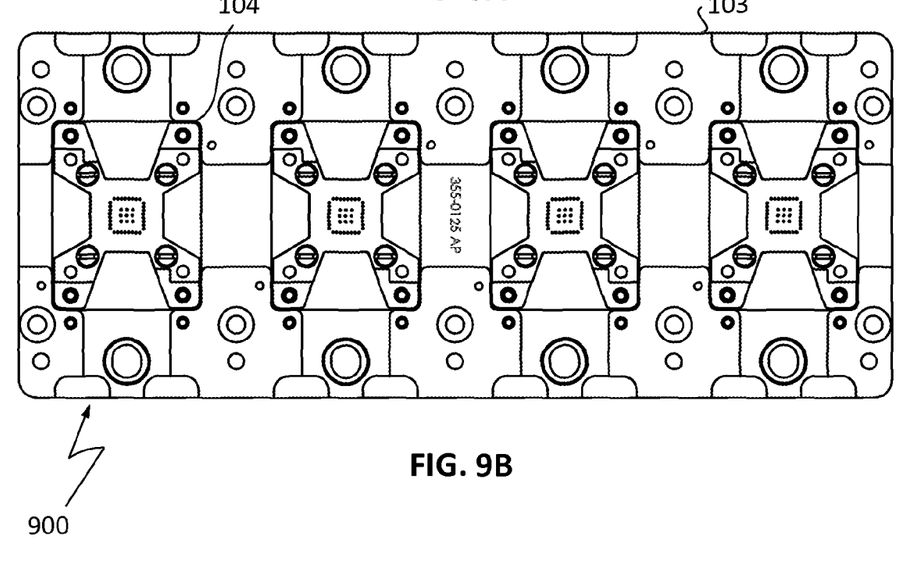
FIG. 9B shows a bottom view of the contactor assembly formed by the pogo block and alignment plate assembly secured to a frame.

FIG. 7A shows a top view of the frame 103 used in an embodiment of the first configuration. As can be seen, the particular frame illustrated is a quad version capable of receiving four pogo block and alignment plate assemblies 104. FIG. 7B shows a bottom view of the frame 103. FIG. 8A and 8B shows top and bottom views, respectively of the alignment plate 201. FIG. 9A and 9B shows top and bottom views, respectively, of the pogo block and alignment plate assembly 104 coupled to the frame 103 providing a contactor assembly 900.

The contactor assembly shown in FIGS. 9A and 9B may, e.g., provide for testing of 5×5 Quad Flat No-Lead (QFN) packages. However, different contactors may be used in other embodiments for other leaded or unleaded package types including thin quad flat packs (TQFPs) and other size packages including 4×4, 8×8, or other sized packages. Note that package sizes are typically denominated in millimeters.

While the first configuration shown in FIG. 1 may be suitable for testing, e.g., a 5×5 package, the product family of the device for which the tester of the first configuration was designed may evolve and utilize different pin-outs, and/or different package sizes to accommodate more pins or a different footprint for a different application. Accordingly, in order to provide flexibility a second PCB configuration is utilized.

Figure 10:
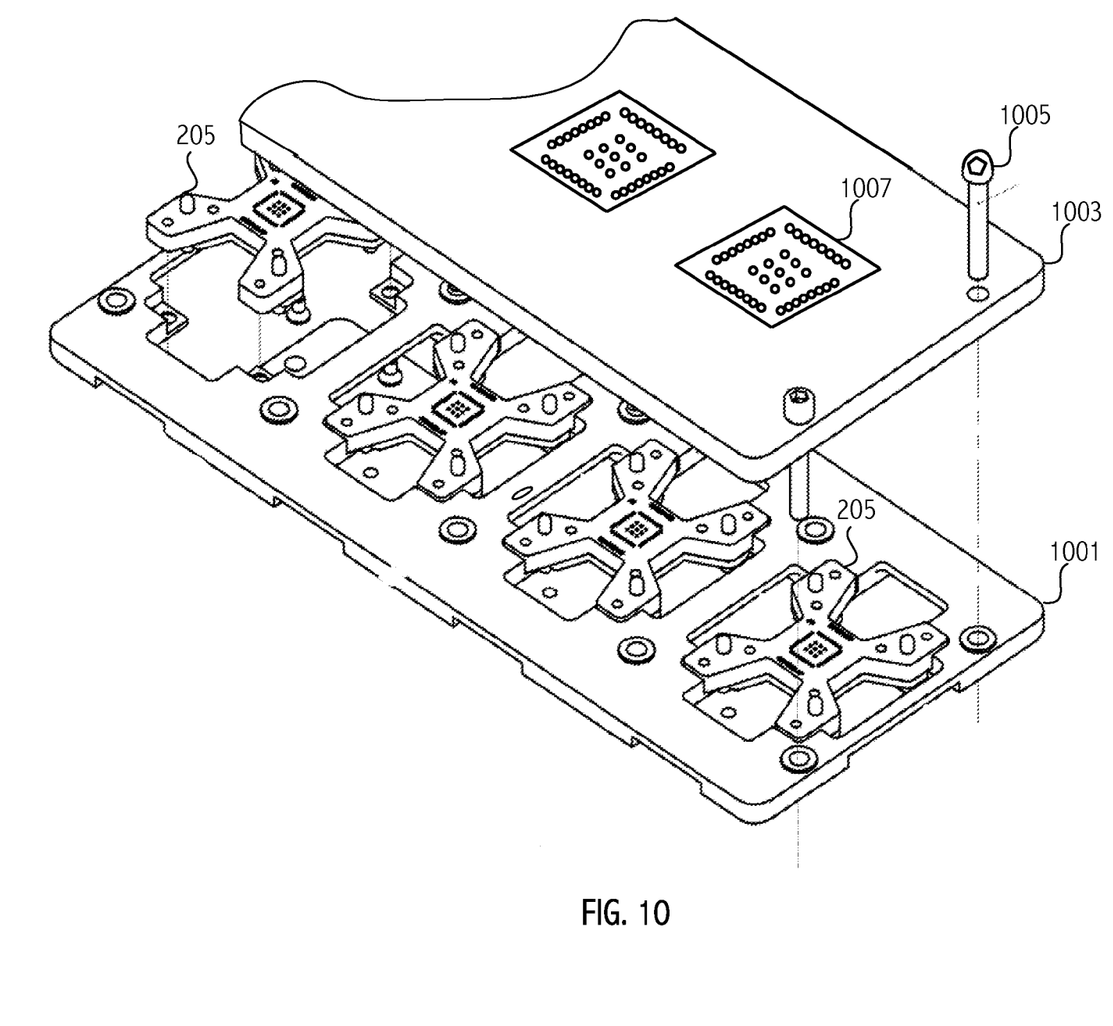
FIG. 10 illustrates a portion of an embodiment of a second configuration of test hardware.

Referring to FIG. 10, a portion of an embodiment of a second configuration is shown. In the second configuration, the pogo block 205 of the pogo block and alignment plate assembly 104 (see FIGS. 1-3) is used with another frame 1001. The alignment plate 201 is removed from the pogo block 205 in the second configuration. The pogo block 205 still electrically couples to the electrical contacts 102 on base PCB 101 (not shown in FIG. 10) as in the first configuration. However, instead of using the frame 103 that allows an alignment guide to be received so the pogo block can connect to the electrical connections of the device under test, the pogo block 205 electrically connects to a daughter card 1003. The frame 1001 is sufficiently thin to allow the pogo pins 209 of the pogo block 205 to electrically contact the contacts on the bottom (not shown) of the daughter card PCB. Thus, the frame 1001 is thinner than the frame 103. Use of the daughter card PCB allows the electrical contacts of the pogo block 205 and underlying base PCB 101 to be translated to different package sizes, contact configurations or pin-out, number of test sites, or types of packages.

Along with the daughter card PCB, as shown herein, a contactor with a different alignment plate and pogo block suitable for different package requirements, along with a thick frame 103, mounts to the daughter card PCB to provide for testing of a different package integrated circuit. Thus, the same base 101 is used to test the different packaged integrated circuit using the same pogo block with a new thin frame. Rather than having to design a whole new base PCB 101, only the daughter card and contactor need to be provided. However, reuse of the pogo block 205 and base PCB 101 provides both cost savings and faster tester development for the new product as there is less to design.

Figure 11:
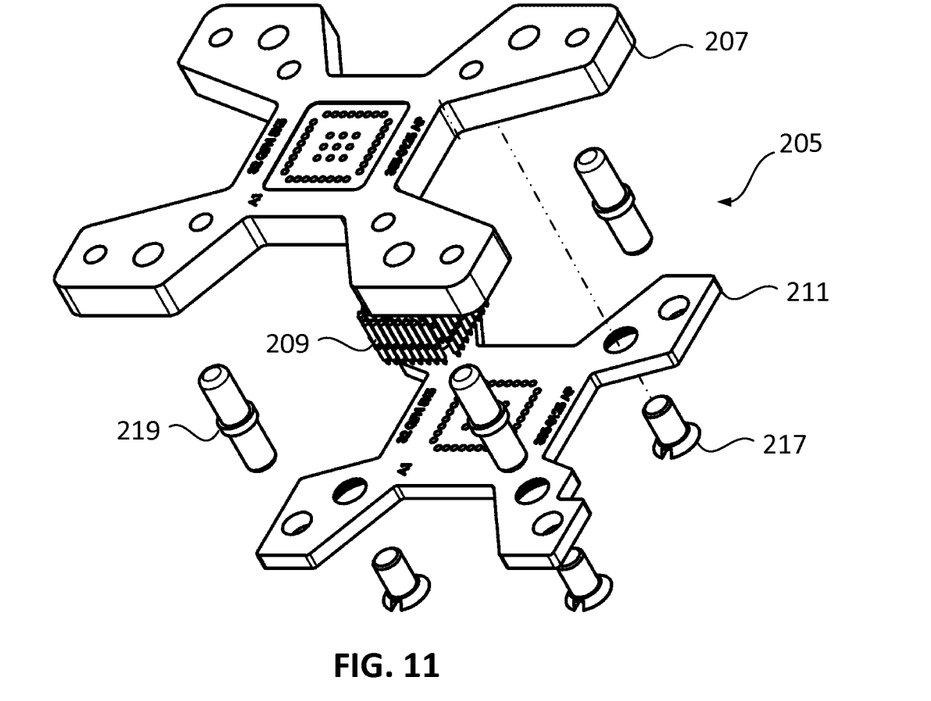
FIG. 11 shows an exploded view of a pogo block suitable for use with the embodiment of FIG. 10.
Figure 12:
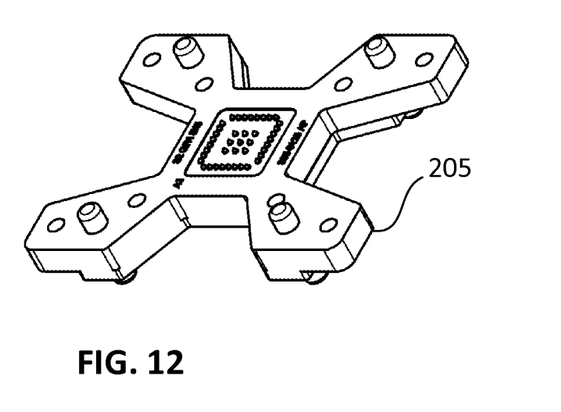
FIG. 12 illustrates a pogo block.
Figure 13:
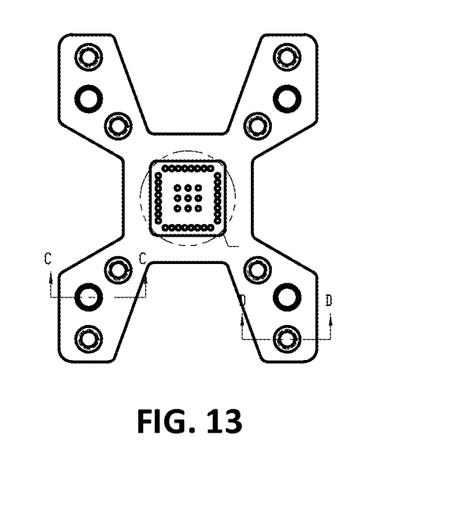
FIG. 13 shows a top view of a pogo block.

FIG. 11 shows an exploded view of a pogo block 205 suitable for use with the embodiment of FIG. 10 including the first portion 207 and the pogo pin retainer 211 and pogo pins 209. FIG. 12 shows a view of pogo block 205. FIG. 13 shows a top view of the pogo block 205.

Figures 14, 15:
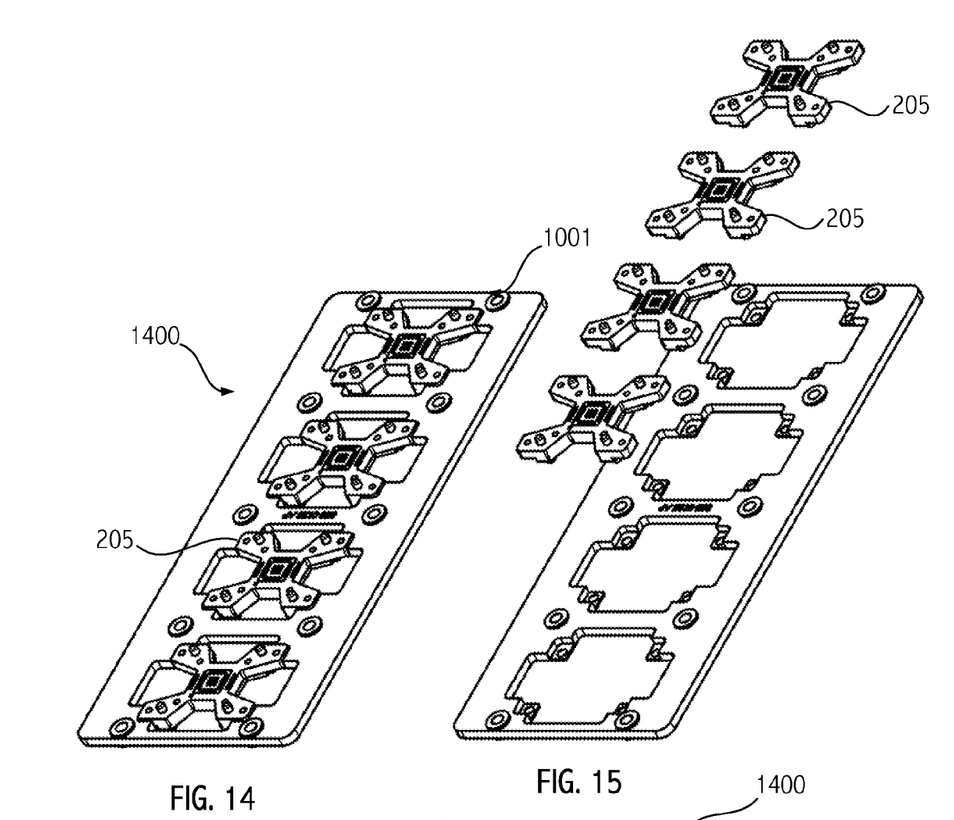
FIG. 14 illustrates a pogo block assembly that includes multiple pogo blocks secured to a frame.
FIG. 15 shows an exploded view of the pogo block assembly.
Figure 16:
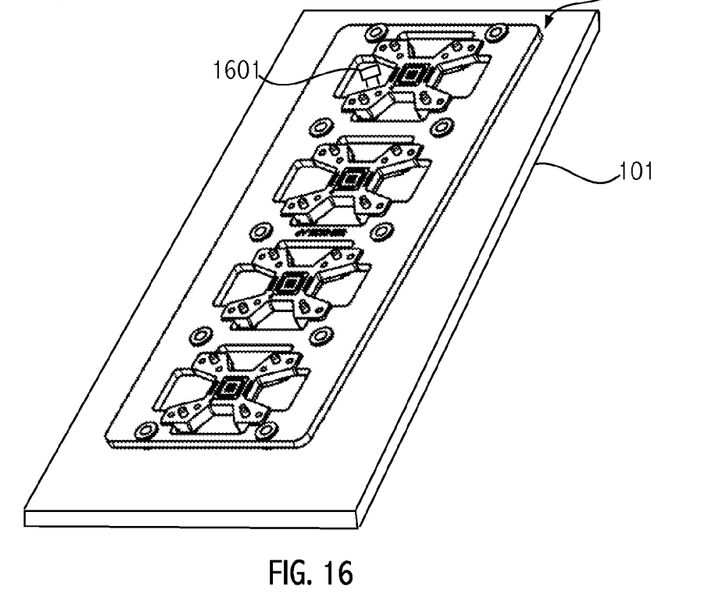
FIG. 16 shows another portion of an embodiment of the second configuration in which the pogo block assembly is secured to the base printed circuit board (PCB).

FIG. 14 shows a pogo block assembly 1400 that includes frame 1001 with pogo blocks 205. In the embodiment of FIG. 14, the frame 1001 is configured to receive four pogo blocks. FIG. 15 shows an exploded view of the pogo block assembly 1400 with frame 1001 and pogo blocks 205. FIG. 16 shows another portion of an embodiment of the second configuration in which the pogo block assembly 1400 is secured to the base PCB 101 to provide for electrical connection from the base PCB 101 to the daughter card 1003 PCB (see FIG. 10).

Figure 17A:
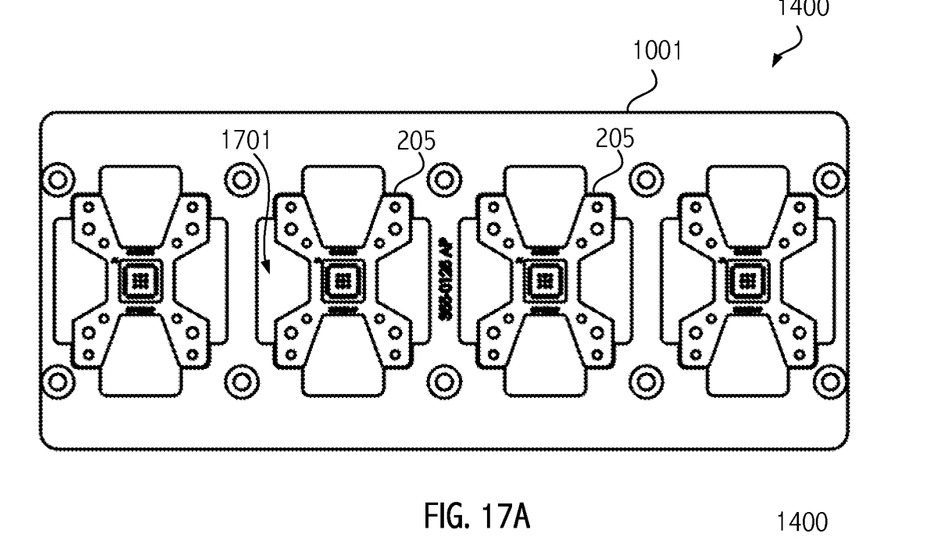
FIG. 17A shows a top view of the pogo block assembly.
Figure 17B:
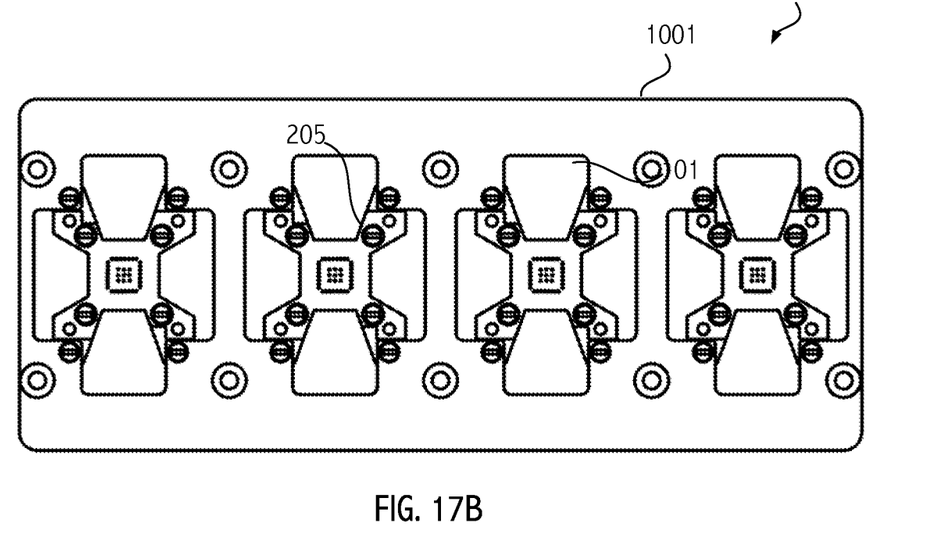
FIG. 17B shows a bottom view of the pogo block assembly.

FIG. 17A and FIG. 17B show top and bottom views, respectively, of the pogo block assembly 1400. With reference to FIG. 17A, note that the pogo block 205 is generally X-shaped but could be any shape required to meet a specific integrated circuit package type. When secured to the frame 1001, a space 1701 exists between the edge of the pogo block 205 and the frame 1001. That space can be exploited in an embodiment of the configuration illustrated in FIG. 16 to allow for components, e.g., capacitor 1601, to be placed on the main test PCB 101 close to the device under test. Thus, for example, when a device under test requires external resistors or capacitors to function properly, those devices can be placed close to the device under test. Note that a component may also be placed on the top side of the base PCB 101 in the first configuration, e.g., in conjunction with the use of the contactor assembly 900 shown in FIGS. 9A and 9B.

Figures 18, 19, 20, 21:
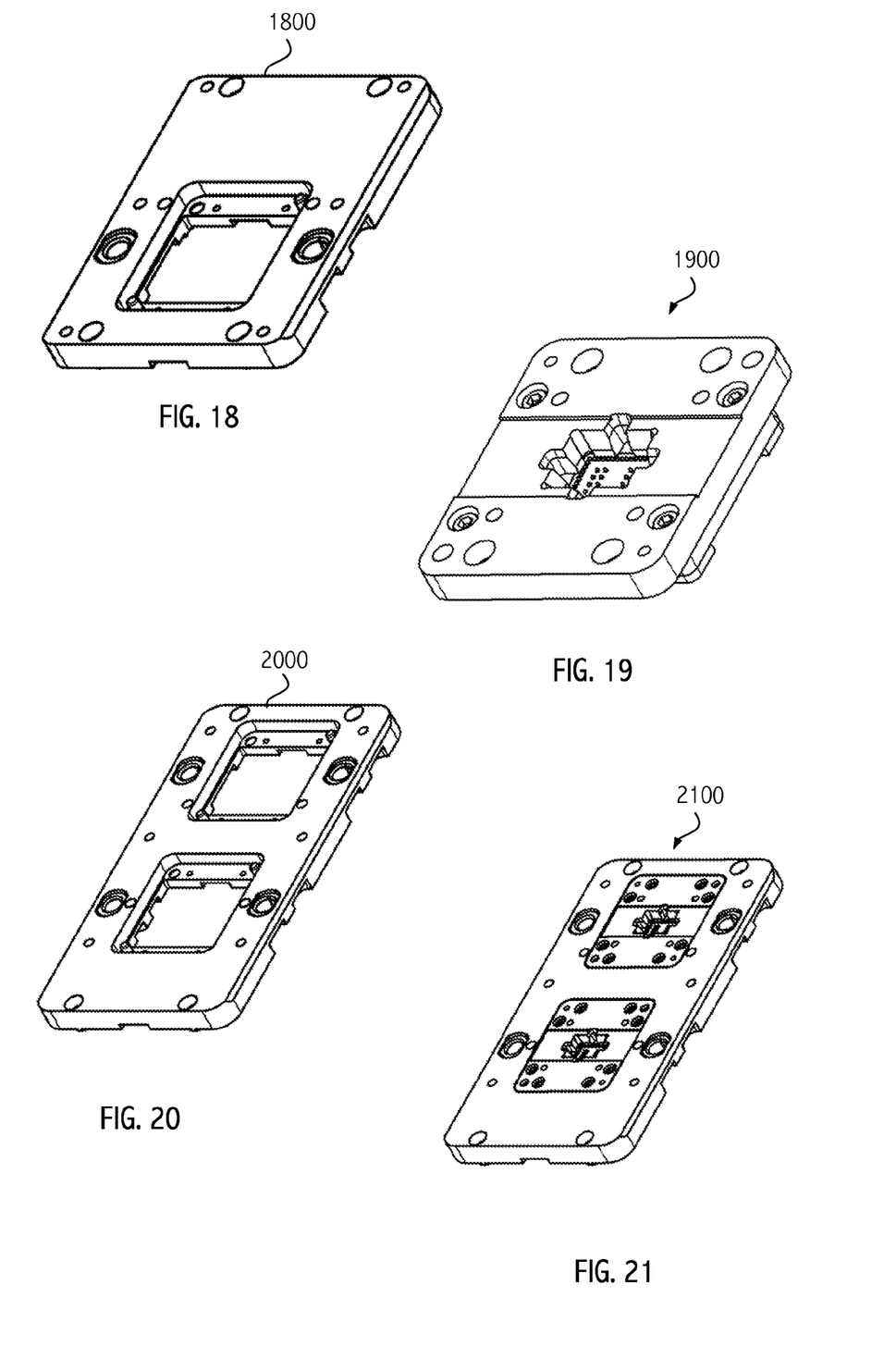
FIG. 18 illustrates an example of a single site frame used in an embodiment of the first configuration.
FIG. 19 illustrates a frame combined with a pogo block and guide plate to form a contactor assembly used in an embodiment of the first configuration.
FIG. 20 illustrates an exemplary dual site frame used in an embodiment of the first configuration.
FIG. 21 illustrates the dual frame combined with pogo blocks and guide plates to form a contactor assembly used in an embodiment of the first configuration.

While embodiments described herein have shown the thick frame 103 in quad configurations, other configurations are possible. FIG. 18 illustrates an example of a single site thick frame 1800. FIG. 19 illustrates the thick frame 1800 combined with a pogo block and guide plate to form a contactor assembly 1900. FIG. 20 illustrates an example of a dual site thick frame 2000. FIG. 21 illustrates the dual frame combined with pogo blocks and guide plates to form a contactor assembly 2100.

Using the approach taught herein, the contactor assembly 900 of FIG. 9A can be reconfigured as a pogo block assembly 1400 (e.g. FIG. 14) by removing the guide plate and thick frame and replacing the thick frame 103 with the thin frame 1001. That allows a number of different types or sizes of packages to be tested while still using the base PCB 101. That provides flexibility that allows cheaper and more rapid testing of additional product family members that may have a different packaging requirement.

Figure 22:
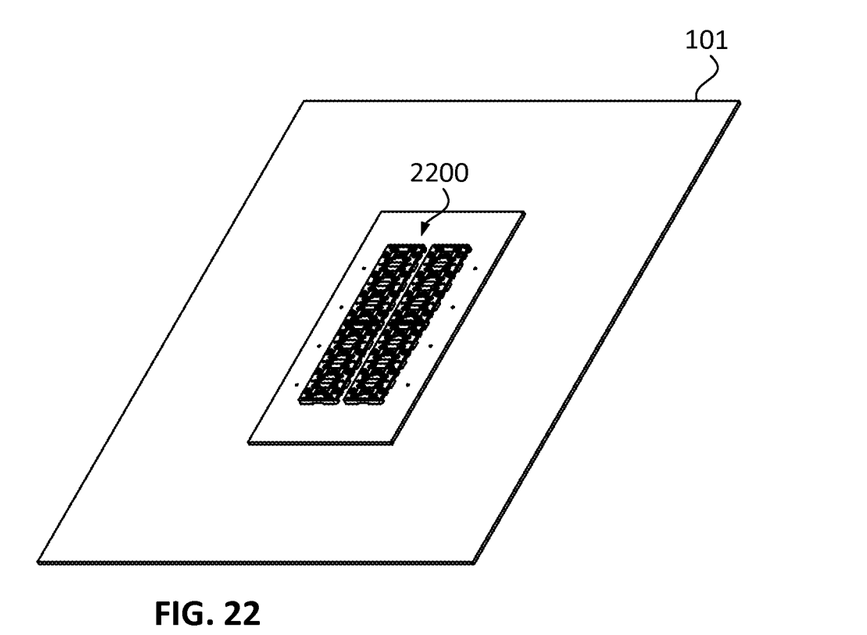
FIG. 22 illustrates a base PCB with four quad pogo block assemblies.
Figure 23:
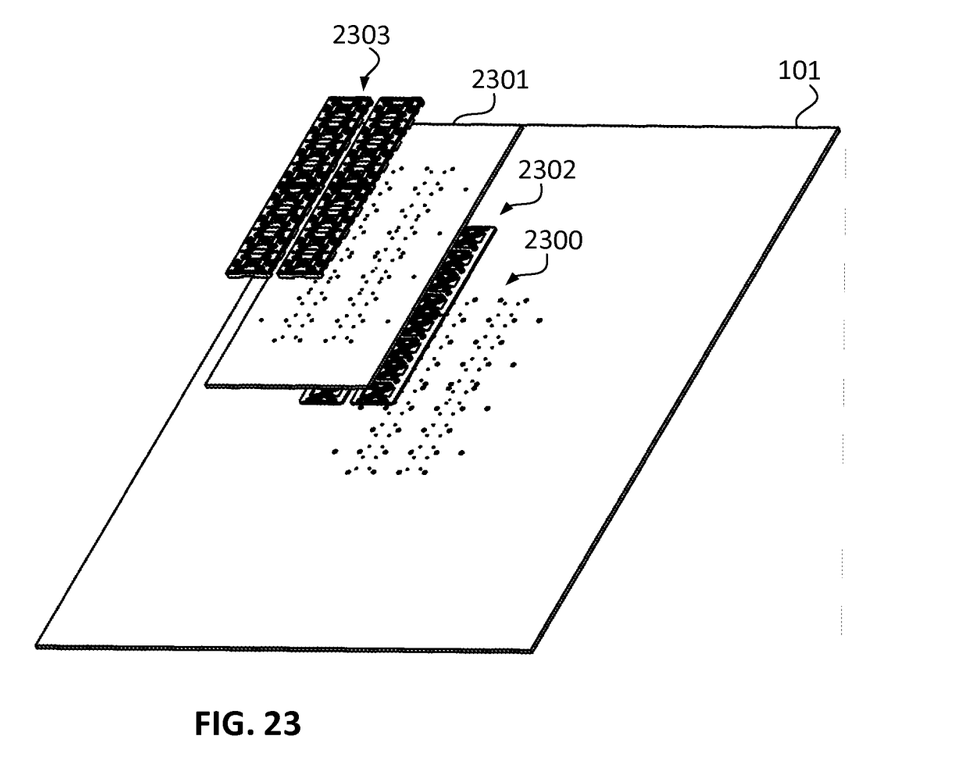
FIG. 23 illustrates a 16 site to 16 site translation according to an embodiment.

That flexibility is illustrated by reference to FIGS. 22 through 25. FIG. 22 shows a base PCB 101 with four quad contactor assemblies 2200, which are coupled to 16 sites of the PCB 101. FIG. 23 shows an exploded view of test hardware using an embodiment of the second configuration that modifies the test hardware configuration of FIG. 22 according to teachings herein. In the system illustrated by FIG. 23, the sixteen sites 2300 of the PCB 101 are electrically coupled to pogo block assembly 2302. The pogo block assembly 2302 reuses the pogo blocks of the contactor 2200. A daughter card PCB 2301 connects to the pogo block assembly 2302 and the daughter card PCB is configured to provide 16 site testing. Four quad contactors 2303 connect to the daughter card thus providing a 16 site to 16 site translation. The contactors 2303 can be configured for a different package size, pin-out or otherwise different from the package provided for by the contactors 2200.

Figure 24:
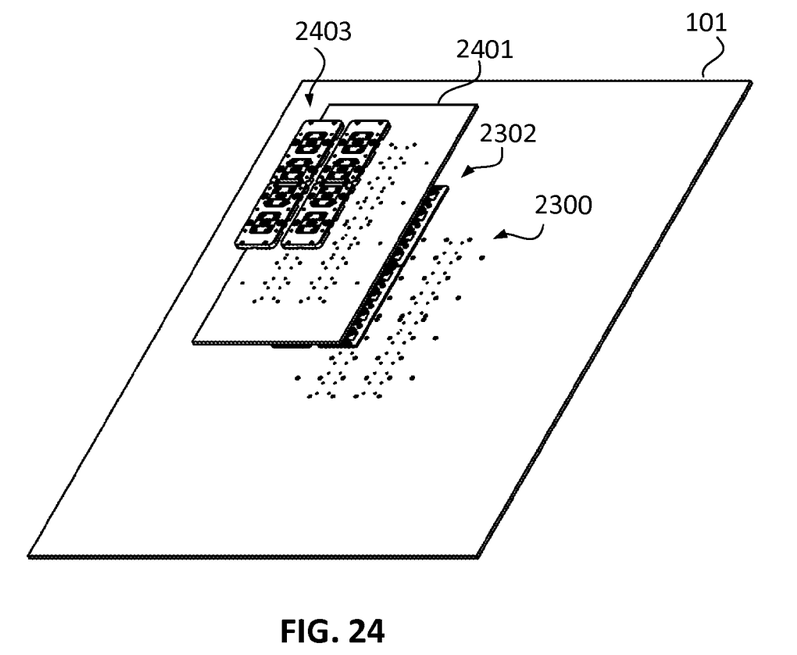
FIG. 24 illustrates a 16 site to 8 site translation according to an embodiment.

With reference to FIG. 24, the 16 site PCB 101 can be translated to an 8 site configuration. In the system illustrated by FIG. 24, the sixteen sites 2300 of the PCB 101 are electrically coupled to pogo block assembly 2302. The pogo block assembly 2302 reuses the pogo blocks of the contactor 2200. A daughter card PCB 2401 connects to the pogo block assembly 2302 and the daughter card PCB is configured to provide 8 site testing. Four dual contactors 2403 connect to the daughter card thus providing a 16 site to 8 site translation. The contactors 2403 can be configured for a different package size, pin-out or otherwise different from the package provided for by the contactors 2200.

Figure 25:
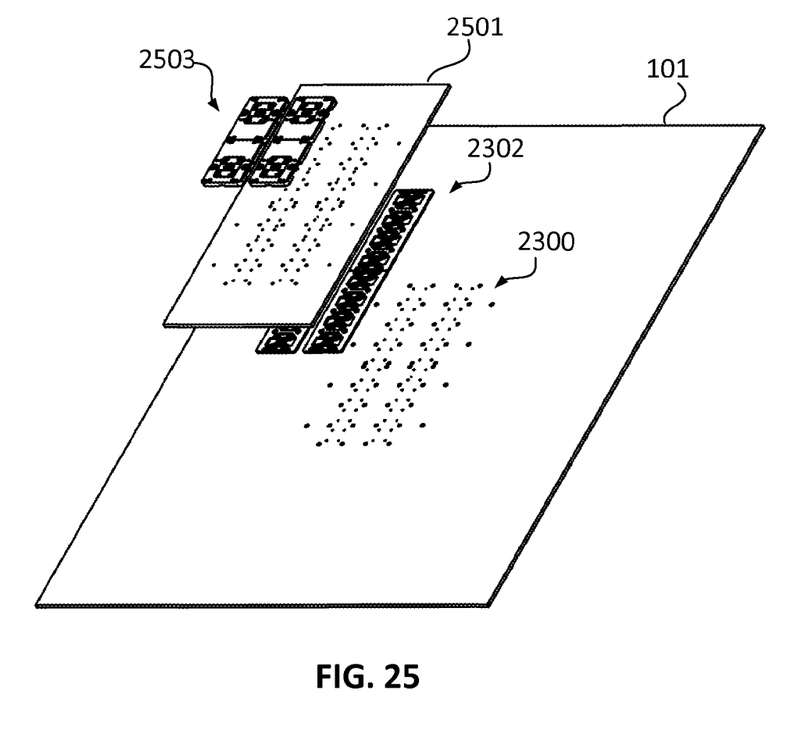
FIG. 25 illustrates a 16 site to 4 site translation according to an embodiment.

In the system illustrated by FIG. 25, the sixteen sites 2300 of the PCB 101 are electrically coupled to pogo block assembly 2302. The pogo block assembly 2302 reuses the pogo blocks of the contactor 2200. A daughter card PCB 2501 connects to the pogo block assembly 2302 and the daughter card PCB is configured to provide 4 site testing. Four single contactors 2503 connect to the daughter card thus providing a 16 site to 4 site translation. The contactors 2503 can be configured for a different package size, pin-out or otherwise different from the package provided for by the contactors 2200.

Thus a contactor functions as direct integrated circuit test socket and can be reconfigured as a pogo block to interface between a main test printed circuit board (PCB) and a daughter card PCB that is dedicated to a specific device handler and/or a specific package type that can be different from the main test PCB. The frames may be standardized so that the insert module (contactor and/or pogo block) can be switched out to support different package types and sizes.

Thus, a system has been described that uses a pogo block in several different configurations. The description of the invention set forth herein is illustrative, and is not intended to limit the scope of the invention as set forth in the following claims. For example, while the embodiments have generally used frames to form the contactor assemblies, other embodiments may utilize the pogo block and alignment plates without frames. Other variations and modifications of the embodiments disclosed herein may be made based on the description set forth herein, without departing from the scope of the invention as set forth in the following claims.

What is claimed is:

1. A tester apparatus comprising:
   a first printed circuit board;
   a pogo block electrically connected to the first printed circuit board on a first side of the pogo block;
   wherein in a first configuration the pogo block is configured to be electrically connected to a packaged integrated circuit under test; and
   wherein in a second configuration the pogo block is electrically connected on a second side of the pogo block to a second printed circuit board, wherein the second printed circuit board provides a translation from the first printed circuit board to provide for testing in the second configuration of a device with at least one of a different package size or different electrical contacts than the packaged integrated circuit under test in the first configuration.

2. The tester apparatus as recited in claim 1 further comprising:
   a first frame coupled to support the pogo block to form a pogo block assembly in the second configuration; and
   the second printed circuit board.

3. The tester apparatus as recited in claim 2 further comprising:
   a second frame coupled to support the pogo block in the first configuration, the second frame being thicker than the first frame.

4. The tester apparatus as recited in claim 3, wherein the first configuration further comprises an alignment plate coupled to the pogo block, the alignment plate to align the packaged integrated circuit to be tested with electrical connections of the pogo block.

5. The tester apparatus as recited in claim 4 further comprising a plurality of screws securing the alignment plate to the pogo block.

6. The tester apparatus as recited in claim 4 further comprising a plurality of screws securing the alignment plate and pogo block to the second frame.

7. The tester apparatus as recited in claim 3 where the first frame has a thickness to allow pogo pins to make electrical contact with the second printed circuit board.

8. The tester apparatus as recited in claim 2, wherein the first frame coupled with the pogo block includes a space allowing a component to protrude from the first printed circuit board into a space between the frame and the pogo block.

9. The apparatus as recited in claim 8 further comprising the component coupled to the first printed circuit board extending into the space formed by the first frame coupled with the pogo block.

10. The tester apparatus as recited in claim 1 where the pogo block is generally X-shaped.

11. The tester apparatus as recited in claim 1 wherein the pogo block comprises:
    a pogo pin retainer portion;
    a plurality of pogo pins; and a portion to receive the pogo pins held in by the pogo pin retainer portion.

12. The tester apparatus as recited in claim 1, wherein the first configuration further comprises an alignment plate coupled to the pogo block, the alignment plate to align the packaged integrated circuit under test with electrical connections of the pogo block.

13. A tester apparatus comprising:
a first printed circuit board;
wherein in a first configuration a pogo block assembly is configured to be electrically connected to the first printed circuit board and to receive a packaged integrated circuit under test, the pogo block assembly including a plurality of pogo blocks and a first frame;
wherein in a second configuration the plurality of pogo blocks are coupled to a second frame, thinner then the first frame, and electrically connected to the first printed circuit board and electrically connected to a second printed circuit board; and
wherein in the second configuration, the second printed circuit board provides a translation from a first number of sites on the first printed circuit board to a second number of sites on the second printed circuit board.

14. The tester apparatus as recited in claim 13 further comprising:
a contactor assembly coupled to the second printed circuit board in the second configuration to receive one or more devices under test.

15. The tester apparatus as recited in claim 13 wherein the first number of sites and the second number of sites are equal.

16. The tester apparatus as recited in claim 13 wherein the first number of sites is more than the second number of sites.

17. The tester apparatus as recited in claim 13 wherein the first configuration provides for testing a first package type and the second configuration provides for testing a second package type.

18. A method of configuring a tester comprising:
configuring the tester in a first or a second configuration, wherein
configuring the tester in the first configuration includes,
securing a pogo block to a first frame and an alignment plate to form a first contactor assembly, the alignment plate to align a packaged integrated circuit under test; and
electrically connecting the pogo block to a first printed circuit board;
wherein configuring the tester in a second configuration includes,
securing the pogo block to a second frame thinner than the first frame;
electrically coupling the first printed circuit board to one side of the pogo block and electrically connecting a second printed circuit board to another side of the pogo block; and
coupling a second contactor assembly including another pogo block, frame, and alignment plate to the second printed circuit board.

19. The method as recited in claim 18 wherein the first contactor assembly is for a first package type and the second contactor assembly is for a second package type.

20. The apparatus as recited in claim 13 wherein the second frame is thin enough to allow pogo pins of the pogo blocks to electrically contact contacts on a bottom of the second printed circuit board.

* * * * *